United States Patent [19]
Hasebe et al.

[11] Patent Number: 5,677,235
[45] Date of Patent: Oct. 14, 1997

[54] METHOD FOR FORMING SILICON FILM

[75] Inventors: Kazuhide Hasebe, Yamanashi-ken; Toshiharu Nishimura, Kofu, both of Japan

[73] Assignees: Tokyo Electron Limited, Tokyo; Tokyo Electron Tohoku Limited, Esashi, both of Japan

[21] Appl. No.: 600,146

[22] Filed: Feb. 12, 1996

Related U.S. Application Data

[63] Continuation of Ser. No. 306,583, Sep. 15, 1994, abandoned.

[30] Foreign Application Priority Data

Sep. 16, 1993 [JP] Japan .................. 5-255050

[51] Int. Cl.$^6$ ............................. H01L 21/20
[52] U.S. Cl. ................ 437/101; 437/225; 437/233
[58] Field of Search ......................... 437/225, 233, 437/101

[56] References Cited

U.S. PATENT DOCUMENTS

| | | | |
|---|---|---|---|
| 4,745,088 | 5/1988 | Inoue et al. | 437/102 |
| 4,877,753 | 10/1989 | Freeman | 437/101 |
| 4,989,540 | 2/1991 | Fuse et al. | 118/719 |
| 5,116,784 | 5/1992 | Ushikawa | 437/225 |
| 5,198,387 | 3/1993 | Tang | 437/101 |
| 5,256,566 | 10/1993 | Bailey | 437/233 |

FOREIGN PATENT DOCUMENTS

| | | |
|---|---|---|
| 326512 | 11/1992 | Japan . |
| 349615 | 12/1992 | Japan . |
| 21378 | 1/1993 | Japan . |
| 182919 | 7/1993 | Japan . |

OTHER PUBLICATIONS

J.M. Blum et al., "Low Pressure CVD Process for Micro and Polycrystalline Silicon," IBM Technical Disclosure Bulletin, vol. 26, No. 3A, pp. 921–922, Aug. 1983.

*Primary Examiner*—Robert Kunemund
*Attorney, Agent, or Firm*—Oblon, Spivak, McClelland, Maier & Neustadt, P.C.

[57] ABSTRACT

A number of semiconductor wafers are retained in a wafer boat such that the wafers are disposed at intervals in the vertical direction. The wafer boat is loaded into a process tube of a vertical type thermal processing apparatus. The inside of the process tube is heated to 300° to 530° C. in a depressurized atmosphere, and a process gas including a disilane gas is fed into the process tube such that the disilane gas flows at a flow rate of 300 SCCM or more, thereby to form silicon films.

7 Claims, 4 Drawing Sheets

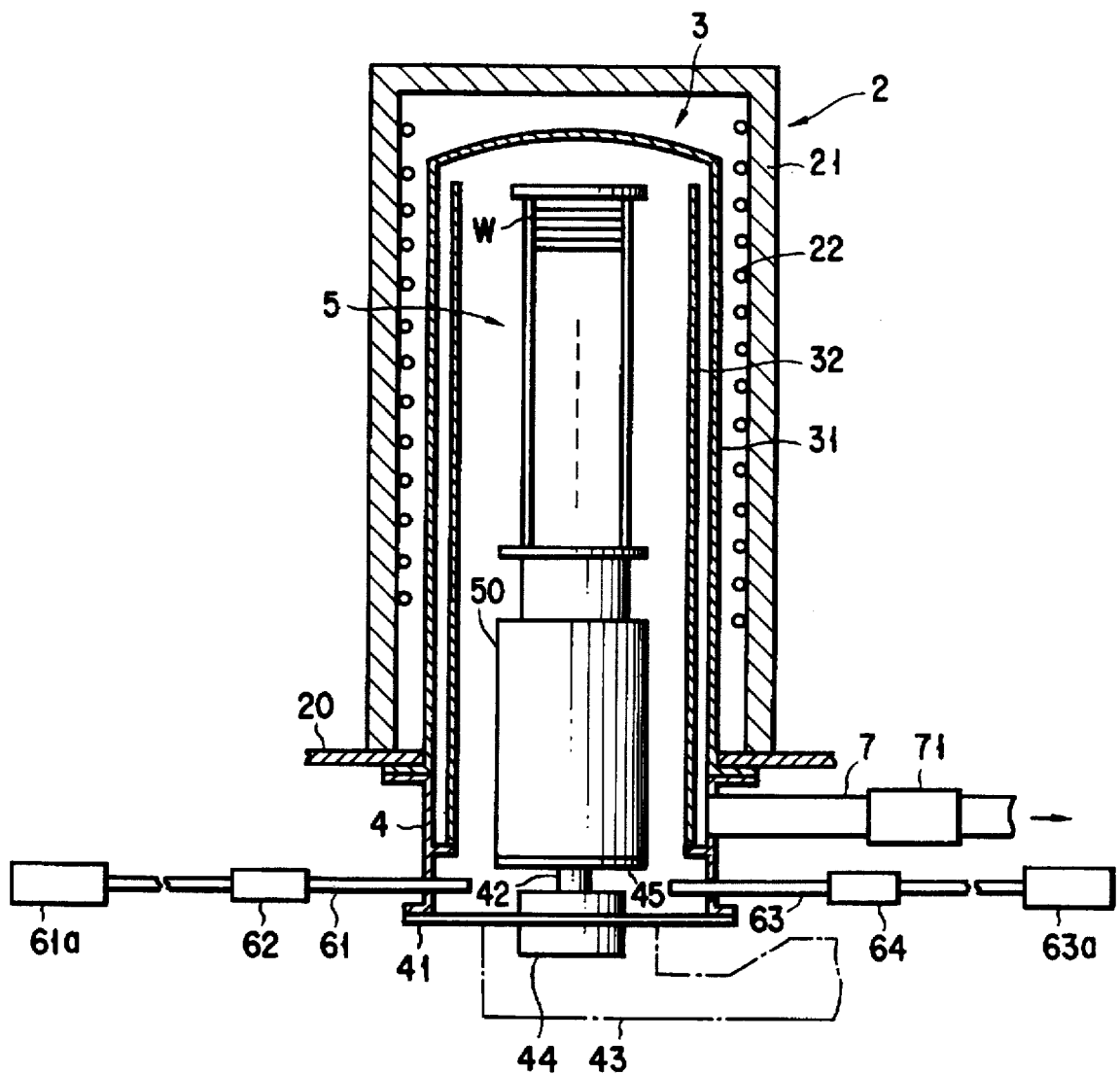
F I G. 2

METHOD FOR FORMING SILICON FILM

This application is a Continuation of application Ser. No. 08/306,583, filed on Sep. 15, 1994, now abandoned.

BACKGROUND OF THE INVENTION

1. Field of the Invention

The present invention relates to a method for forming a silicon film on a target object such as semiconductor wafer.

2. Description of the Related Art

A vacuum CVD (Chemical Vapor Deposition) method is well known as a method for forming films which is used in process of manufacturing a semiconductor device. In this method, a process gas is supplied to a semiconductor wafer as a target object in a depressurized atmosphere, and components of the process gas are deposited on the surface of the target object by a gas phase reaction. This method attains a high controllability, and is therefore widely used.

As an apparatus for performing this vacuum CVD processing onto a number of wafers in form of a batch-treatment, a vertical type heat treatment apparatus is almost typically used since this type of apparatus.

In a vertical type thermal treatment apparatus, a number of wafers are placed at intervals on a wafer boat, and the wafer boat holding the wafers is loaded into a reaction tube retained in the vertical direction, thereby to perform a heat treatment. Various thin films can be formed wafers by using this vertical type apparatus to perform vacuum CVD method processing. An amorphous silicon film into which P (phosphorus) is doped is one of thin films formed in this manner. In this case, a phosphine ($PH_3$) gas as a doping gas and a disilane gas ($Si_2H_6$) as a film forming gas are simultaneously supplied into a reaction tube to form a film. The reason why a disilane gas is thus used as a film forming gas is as follows. Crystal grains having large diameters can be obtained when amorphous silicon is crystallized, and as a result, it is possible to decrease resistance of a film into which impurities are doped and to improve characteristics, such as TFT and the likes, of a film into which impurities are not doped. In addition, the doping characteristic can advantageously be controlled with ease.

Disilane is decomposed into $SiH_4$ and $SiH_2$ as described in the following formula (1)

$$Si_2H_6 \rightarrow SiH_4 + SiH_2 \qquad (1)$$

Of these decomposed materials, a large amount of $SiH_4$ is adsorbed to a wafer surface and is decomposed thereon, so that a silicon film can easily be deposited uniformly on the wafer surface. However, since $SiH_2$ has a high reactivity, most of $SiH_2$ is thermally decomposed in a gas phase, and is particularly deposited on peripheral portions of a wafer, thereby deteriorating the uniformity of a film thickness on the wafer surface. Further, since $SiH_2$ has a high reactivity, a special wafer boat as shown in FIG. 1 is used when processing for forming films is carried out by a vertical type thermal treatment apparatus with use of a disilane gas.

In the wafer boat 1, a horizontal outer ring 11 is fixed to a support column 12 on every stage, and an inner ring 13 for retaining wafers at a position higher than the outer ring 11 is provided along the inner circumferential edge of the outer ring 11. This wafer boat is loaded into a reaction tube, and the inside of the reaction tube is heated to, for example, 510° C. In a depressurized atmosphere of about 0.5 Torr, a disilane gas and if necessary, a phosphine gas are respectively made flow at a flow rate of 80 to 100 SCCM and a flow rate up to 500 SCCM in according with a desired phosphorus density, through the reaction tube from a lower portion toward an upper portion, and an amorphous silicon film doped with phosphorus or a non-doped amorphous silicon film is thereby formed.

The inner ring 13 is used for the following reasons. At the circumferential edge of an outer ring 11, gas phase decomposition occurs as explained above, and therefore, if a wafer W is mounted on the outer ring 11, the film thickness of a film formed on the wafer is much greater at a peripheral portion of the film than at a center portion of the film, so that the uniformity of film thickness within the wafer surface is thus lowered. However, if an inner ring 13 is used to place a wafer W at a position inside the circumferential edge of the outer ring 11 and at a level higher than the outer ring 11, a region where gas flows at a high flow rate can be avoided, and as a result, the uniformity of the film thickness within the wafer surface can be improved.

However, the special wafer boat as described above requires much manufacturing labor and costs. Further, since a wafer is placed at a position higher than an outer ring 11, a space having a greater height is required for maintaining a wafer W, and therefore, the number of wafers which can be set in one special wafer boat, i.e., the number of wafers which can be processed by one batch-treatment is reduced, thereby causing a decrease in through-put.

SUMMARY OF THE INVENTION

The present invention has been made in view of the above situation, and has an object of providing a method for forming a silicon film, in which a silicon film can be formed through a CVD method by supplying a disilane gas onto a target object without using any special tool for maintaining the target object, a film can be formed at a high efficiency, and the film thickness of the film has a high uniformity within the wafer surface.

According to the present invention, a method for forming a film on a surface of a target object to be processed, comprises steps of:

retaining a number of target objects in a retainer such that the objects are arranged at intervals in a longitudinal direction;

transporting the retainer retaining the target objects into a reaction vessel such that the longitudinal direction thereof is vertical;

heating the space inside the reaction vessel to 300° to 500° C.;

maintaining a space inside the reaction vessel in a depressurized atmosphere; and supplying a process gas including a disilane gas into the reaction vessel such that the disilane gas flows at a flow rate of 300 SCCM or more. Silicon film are formed on the target objects in this manner.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIG. 2 is a sectional view showing an example of a film formation apparatus used for practicing the method according to the present invention;

DETAILED DESCRIPTION OF THE PREFERRED EMBODIMENT

Figure 1:
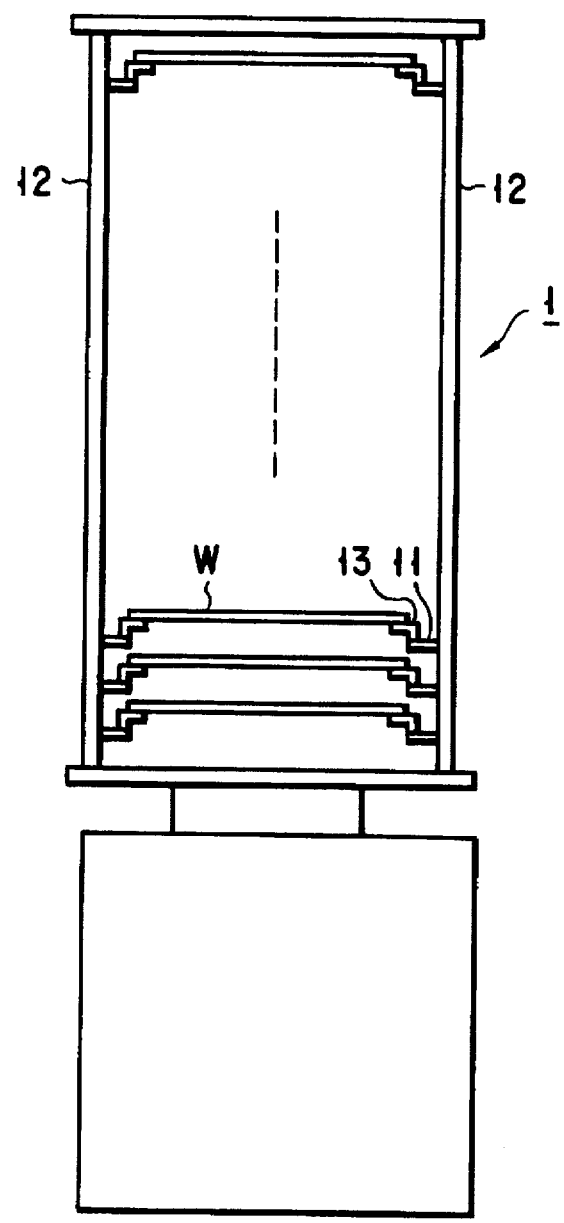
FIG. 1 is a sectional view showing a wafer boat used in a conventional film formation method.

The present inventors have made a great deal of studies to establish a method in which a silicon film is formed on a semiconductor wafer with a high film thickness uniformity within the wafer surface and with a high efficiency by using a disilane gas in a vertical type thermal treatment apparatus. As a result of this, the present inventors have found that both of a high thickness uniformity within the wafer surface and a high film formation efficiency are obtained by supplying a disilane gas into a reaction vessel, which is maintained in a depressurized atmosphere at a predetermined temperature, at a flow rate of 300 SCCM or more. This range of flow rate is much higher than a conventional flow rate of 80 to 100 which has been considered as an optimal flow rate for a disilane gas.

The present invention has thus been made on the basis of the above findings. In the present invention, a retainer maintains a number of target objects such as semiconductor wafers such that the objects are disposed at intervals in the vertical direction, and the retainer is transported into a reaction vessel. The inside of the reaction vessel is heated to a temperature of 300° to 530° C. while being kept in a depressurized atmosphere, and silicon films are formed by supplying a process gas including a disilane gas into the reaction vessel such that the disilane gas flows at a flow rate of 300 SCCM or more. Under the condition that an internal temperature of the reaction vessel 300° to 500° C. and that a flow rate of a disilane gas is 300 SCCM or more, a thin film having a high thickness uniformity within a surface area can be formed for the following reasons. A disilane gas is decomposed and thereby generates $SiH_2$ which has a high reactivity. Therefore, at a conventional flow rate of 100 SCCM, a difference appears between the flow rate of the gas at a central portion of a target object and the flow rate at a peripheral portion thereof, and causes lack of uniformity in film thickness of the film formed on the target object. However, such a difference between the flow rates at a center portion and at a peripheral portion can be reduced by supplying the gas at a high flow rate of 300 SCCM or more.

As a result of this, without using any special tool for retaining a target object as in a conventional method, it is possible to improve the uniformity in film thickness of a silicon film within a surface area of a target object. In addition, the film formation speed can be improved in comparison with a conventional method, and the number of retainable target objects can be increased since a special retaining tool is not necessary as described above. It is therefore possible to improve the efficiency of film formation processing.

In the present invention, a silicon film which is formed on a target object may be a doped silicon film or a non-doped silicon film. Further, the size of a semiconductor wafer as a target object is not restricted. More specifically, the present invention is sufficiently advantageous as far as the flow rate of a disilane gas is 300 SCCM or more, regardless of the size of a semiconductor wafer, e.g., regardless of whether a 6-inch wafer or 8-inch wafer is used as the target object.

In addition to a disilane gas for forming a film, a doping gas is included in a process gas when the film should be doped. For example, when P (phosphorus) is doped, a phosphine ($PH_3$) gas is used together, or when B (boron) is doped, a boron fluoride ($BF_3$) gas is used together. If necessary, gases may be diluted.

The upper limit of the flow rate of a disilane gas need not be defined from the view point of uniformity of a film thickness within a surface area. However, since the disilane gas must be exhausted as a diluted gas having a density of 0.5% or more, the upper limit of the flow rate is set to 3000 SCCM. The flow rate is desirably within a range of 500 to 1,500 SCCM.

The internal pressure of the reaction vessel may be set to a range which coincides with a depressurized condition under which this kind of film formation processing is normally carried out, and is, for example, set to a range of 0.1 to 10 Torr.

The heated temperature during film formation is set to 300° to 530° C. because the film formation speed is decreased if the temperature is 300° C. or less, and the uniformity of film thickness is deteriorated if the temperature is higher than 530° C. A desirable temperature range is 425° to 500° C.

Next, a preferred embodiment of the present invention will be explained below.

FIG. 2 is a longitudinal sectional view showing an example of a film formation apparatus used for practicing the method according to the present invention. A heating furnace 2 is placed on a base plate 20, and comprises a heat insulating member 21 and a heater 22 arranged on the inner circumferential surface of the member 21 such that the heater 22 surround a reaction tube 3.

In the heating furnace 2, there is provided a reaction tube 3 having a double tube structure, which comprises an outer tube 31 made of quartz or the like and closed in its upper end, and an inner tube 32 made of quartz or the like and provided inside the outer tube 31 such that the inner tube 32 is coaxial with the outer tube 31. The outer and inner tubes 31 and 32 are connected with each other, and the internal space inside these tubes is set to be a processing atmosphere, in which film formation is carried out. The size of the inner tube 32 is arranged such that the inner diameter is, for example, 25 cm and the length is, for example, 150 cm.

The lower end portions of the outer and inner tubes 31 and 32 are supported by a tube-like manifold 4 made of stainless steel or the like, and the manifold 4 has an opening portion at its lower end, which is provided with a cap portion 41 for air-tightly enclosing the opening portion.

Figure 3:
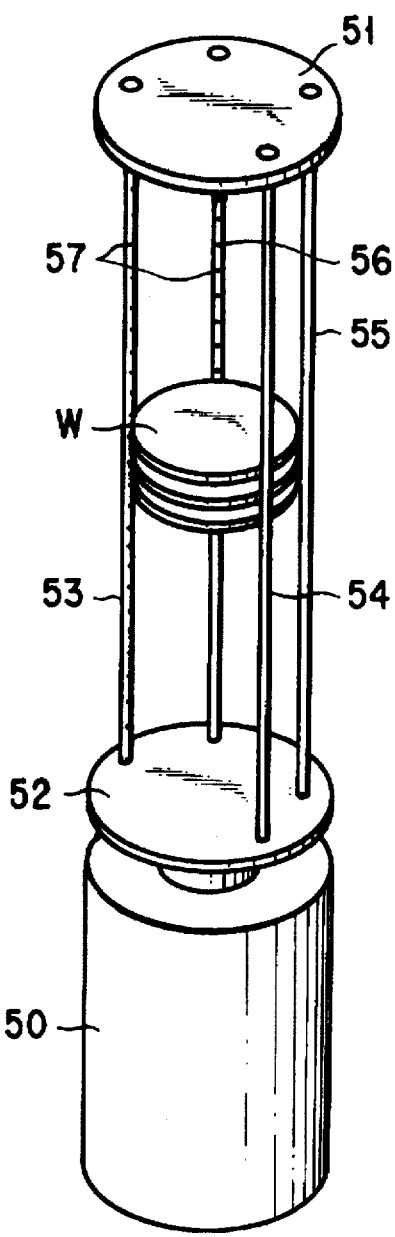
FIG. 3 is a perspective view showing a wafer boat used as a target object retainer of the present invention.

A rotation shaft 42 rotatable with air-tightness being maintained by a magnetic seal penetrates through the center portion of the cap portion 41, and the rotation shaft 42 has a lower end connected to a rotation mechanism 44 of a elevator 43 and an upper end fixed to a turn table 45. A wafer boat 5 made of quartz or the like which serves as a target object retainer is provided above the turn table 45, with a heat insulating tube 50 being inserted between the boat and the table. As shown in FIG. 3, the wafer boat 5 comprises a top plate 51, a bottom plate 52, and four support columns 53 to 56 provided between the top and bottom plates. Grooves 57 for retaining peripheries of wafers W are formed at corresponding positions in the support columns 53 to 56, such that one hundred of wafers W are contained and arranged at intervals in the vertical direction by a pitch of 4.76 mm.

A film formation gas introducing tube 61 for introducing a disilane ($SiH_2H_6$) gas as a film formation gas into the internal tube 32 is horizontally inserted through a lower side wall of the manifold 4. The film formation gas introducing tube 61 is connected with a film formation gas source 61a through a mass-flow controller 62.

Further, a doping gas introducing tube 63 for introducing a doping gas such as a phosphine ($PH_3$) gas into the inner tube 32 is inserted though another lower side wall of the manifold 4. The doping gas introducing tube 63 is connected with a doping gas source 63a through a mass-flow controller 64.

An exhaust tube 7 is inserted through an upper side wall of the manifold 4, in order to exhaust a process gas from a clearance between the outer and inner tubes 31 and 32 so that the inside of the reaction tube 3 is set to be a predetermined depressurized atmosphere. The exhaust tube 7 is connected with a vacuum pomp 71 for exhausting gases.

In the following, explanation will be made to an example of a film formation method practiced by using a film formation apparatus as has been described above. At first, the inside of the reaction tube 3 is heated by a heater 22 such that the film formation temperature is maintained, for example, at 450° C., e.g., the center portion (which means a center portion extending in the vertical direction) of the wafer boat 5 is heated to a temperature of 450° C. Then, the wafer boat 5 retaining, for example, one hundred of wafers W is transported into the reaction tube 3 from a lower opening portion by using an elevation base 43.

Next, the inside of the reaction tube 3 is depressurized, for example, to a degree of vacuum of about a few milli-Torr, and thereafter, a disilane gas is introduced from the film formation gas source 61a through the film formation gas introducing tube 61 into the inner tube 32 at a flow rate of, for example, 500 SCCM. At the same time, a phosphine gas is introduced from the doping gas source 63a through the doping gas introducing tube into the inner tube 32 at a flow rate of, for example 200 SCCM. Also at the same time, the inside of the reaction tube 3 is exhausted so that the inside of the reaction tube is maintained at a pressure of, for example, 0.5 Torr, and film formation processing for 50 minutes is thus carried out with the wafer boat 5 being rotated at a rotation speed of 0.5 rpm.

By the above-mentioned film formation processing, an amorphous silicon film doped with phosphorus is obtained. The amorphous silicon film thus obtained has a high uniformity in film thickness within a surface area of a wafer, since the film formation temperature is 450° C. and a disilane gas is fed into the reaction tube 3 at a high flow rate of 500 SCCM.

Figure 4:
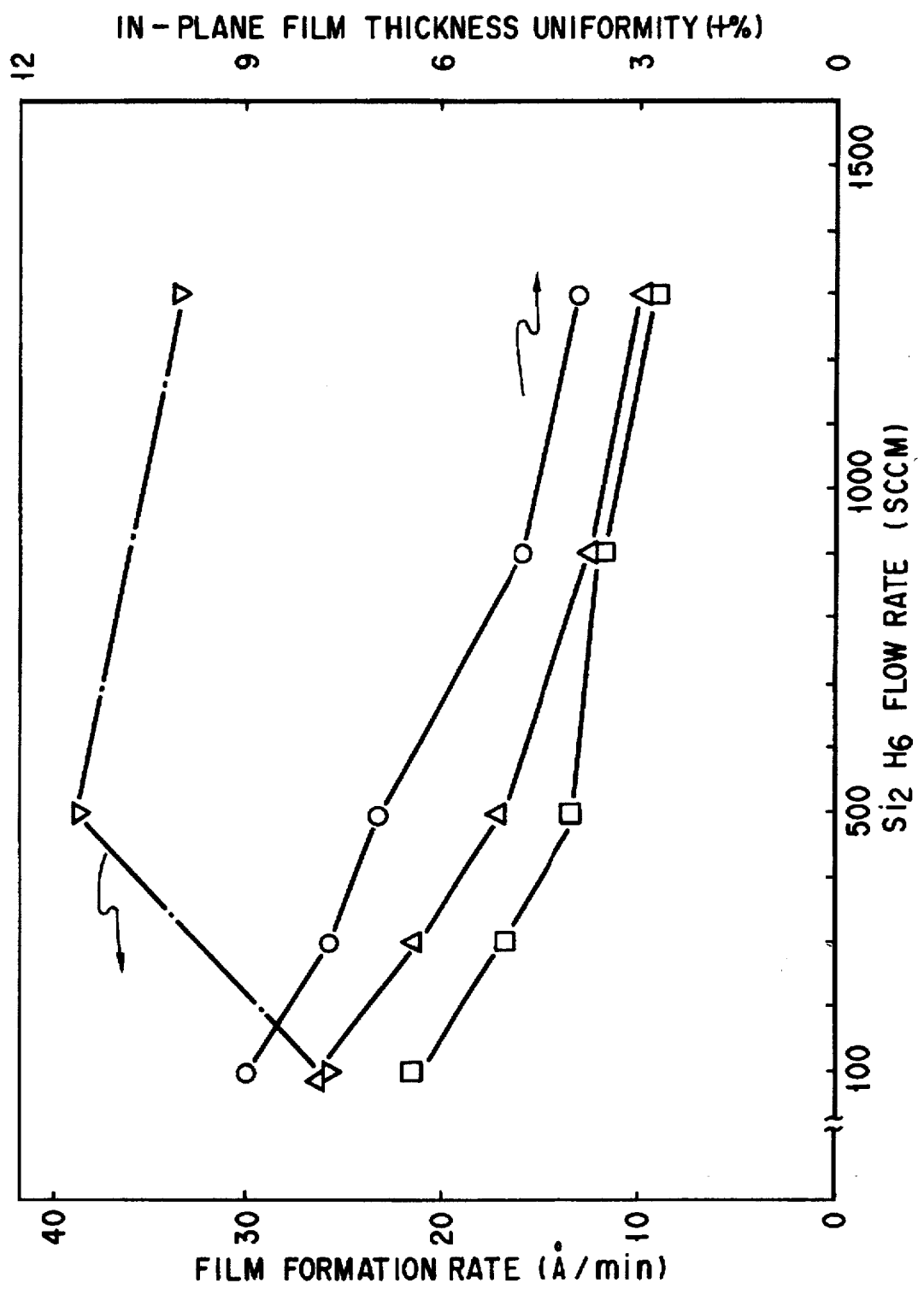
FIG. 4 is a graph showing a relationship between a flow rate of disilane gas, a film thickness uniformity, and a film formation speed.

Meanwhile, film formation was carried out under condition that the film formation temperature was set to 475° C., the flow rate of a disilane gas was set to 100 to 1,300 SCCM, and 8-inch wafers were retained in a normal wafer boat. The uniformity in film thickness within a wafer surface and the film formation rate were inspected with respect to amorphous silicon films formed under the above condition. The investigation results are shown in FIG. 4. In FIG. 4, the abscissa axis indicates the flow rate of a disilane gas, and the ordinate axis indicates the uniformity in film thickness within the wafer surface and the film formation rate. The uniformity in film thickness within a wafer surface is expressed as a rate of a difference between the thickness at a peripheral portion of a wafer and an average film thickness of the wafer, to the average film thickness of the wafer. In addition, the film thickness at the peripheral portion is measured at a position 10 mm distant from the outer edge of a wafer toward the center thereof. In FIG. 4, a circular plot, a triangle plot, and a rectangular plot respectively indicate data values inspected with respect to the first wafer (positioned at the top of the wafer boat), the fiftieth wafer (positioned in the middle of the wafer boat), and the hundredth wafer (positioned at the bottom of the wafer boat). Further, a plot expressed as a reverse triangle indicates a data value inspected with respect to the film formation rate.

As is apparent form FIG. 4, it is found that the uniformity in film thickness within a wafer surface area is increased as the flow rate of disilane gas is increased. The film formation rate rapidly increases up to 500 SCCM.

Figure 5:
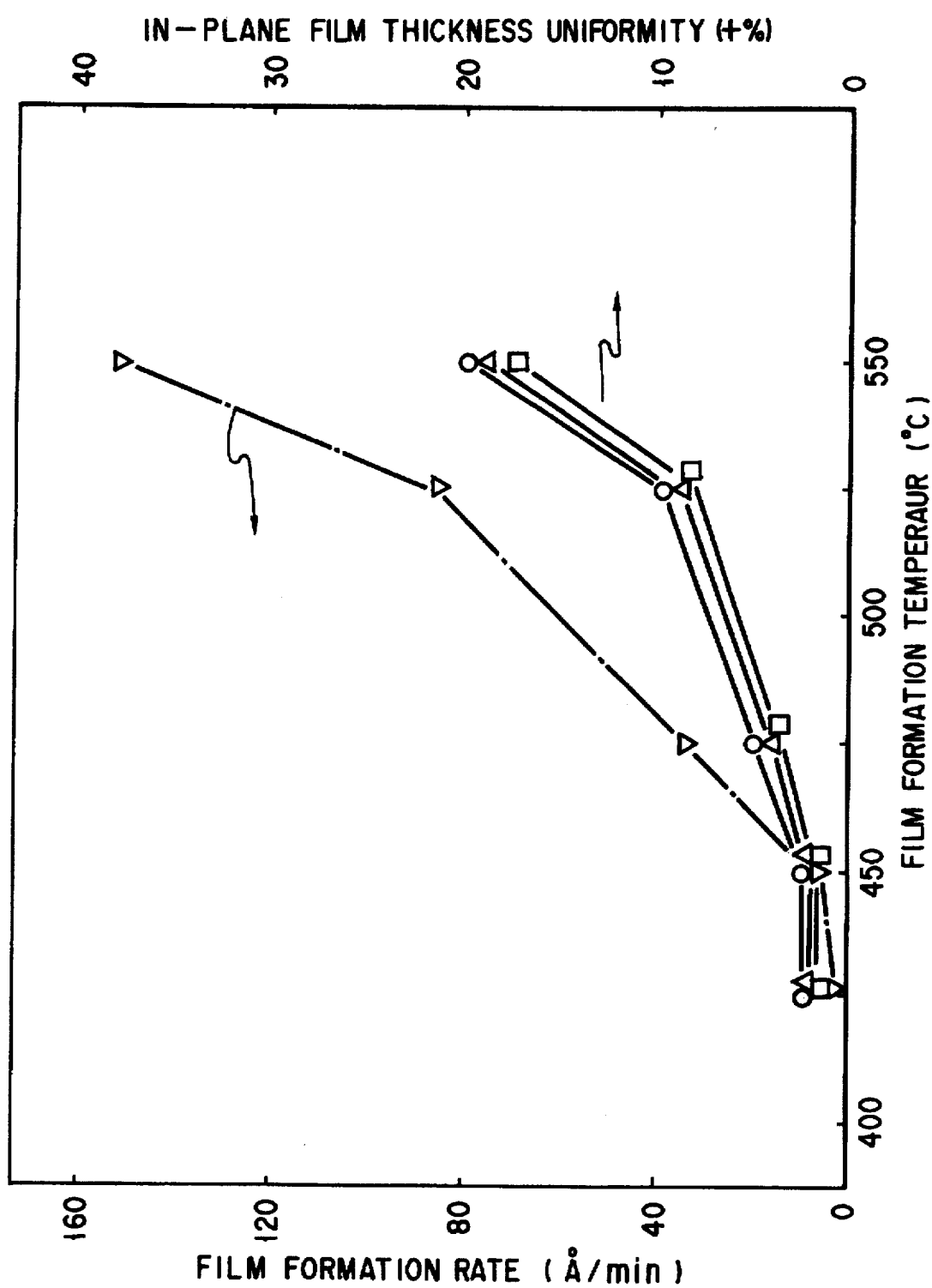
FIG. 5 is a graph showing a relationship between a film formation temperature, a film thickness uniformity, and a film formation speed.

Further, inspection as to influences of the uniformity in film thickness within a wafer surface area and of the film formation rate onto the film formation temperature was carried out with respect to amorphous silicon films which were formed under condition that the film formation temperature was set to 425° to 550° C. and the flow rate of a disilane gas was set to 500 SCCM. The inspection results are shown in FIG. 5. In FIG. 5, the ordinate axis and the reference plots indicate the same as those used in FIG. 4, but the abscissa axis of FIG. 5 indicates the film formation temperature. The other processing conditions are the same as those explained above with reference to FIG. 4.

From this figure, it is found that the uniformity in film thickness within a wafer surface area is very excellent where the film formation temperature is about 475° C. or less, the uniformity is slightly deteriorated and but is applicable for practical use where the film formation temperature is about 530° C. or less, and the uniformity is rapidly deteriorated where the film formation temperature is higher than about 530° C. Therefore, in view of practical use, the film formation temperature should be 530° C. or less. In addition, where the film formation temperature is low, e.g., 425° C., the film formation speed is lowered so that a long time is required. Hence, it is confirmed that the film temperature is desirably be 425° C. or more.

As can be seen from the above results, the uniformity in film thickness within a wafer surface area can be improved by adopting the film formation processing according to the present invention.

The reasons why the uniformity in film thickness is improved by the processing of the present invention, as has been described above are guessed as follows. Firstly, when a disilane gas flows at a high flow rate of 300 SCCM, a difference between the flow rate of the gas at a peripheral portion of a wafer and the flow rate of the gas at a center portion thereof is small, and $SiH_2$ which serves as an active component does not react easily at an edge portion of the wafer due to presence of a disilane gas which has not been decomposed. Secondly, when the film formation temperature is 530° C. or less, the processing is close to the reagain in which the reaction is rate determining step so that the amount of $SiH_2$ of reactive species generated by decomposition of $Si_2H_6$ in a gas phase is not relatively large.

Thus, according to the present invention, it is possible to obtain a high uniformity in film thickness within a wafer surface area without using any special wafer boat as required for a conventional method, so that film formation processing can be performed with use of a normal wafer boat. As a result, manufacturing costs can be reduced. In addition, in the present invention, the number of wafers which can be contained in a wafer boat is as approximately twice large as the number of wafers which can be contained in a conventional special wafer boat, and therefore, through-put can be improved.

Note that the present invention is not limited to film formation of a thin film which is doped with phosphorus, but is applicable to film formation of a thin film doped with boron (B), for example, by using a $BF_3$ gas or a thin film which is not doped with impurities, as has been explained above. Further, the present invention is not limited to use of a wafer boat as cited in the above embodiment, but a special wafer boat used in a conventional method may be used in the present invention. With use of such a special wafer boat, advantages of the present invention can be sufficiently attained. A target object to be processed is not limited to a semiconductor wafer as described above, but may be any other object on which a silicon film can be formed by a batch-treatment.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method for forming a silicon film on a surface of a target object to be processed, comprising steps of:

retaining a number of target objects in a retainer such that the objects are arranged at intervals in a longitudinal direction;

transporting the retainer retaining the target objects into a reaction vessel such that the longitudinal direction thereof is vertical;

heating the space inside the reaction vessel to 300° to 500° C.;

maintaining a space inside the reaction vessel in a depressurized atmosphere; and supplying a process gas including a disilane gas into the reaction vessel such that the disilane gas flows at a flow rate per unit area of the target objects ranging from 48 to 480 $SCCM/m^2$, the disilane gas being brought into contact with surfaces of the target objects and decomposed into components by heat, and the components being deposited onto the surfaces of the target objects, thereby to form polysilicon films on the target objects.

2. A method according to claim 1, wherein said process gas including a doping gas.

3. A method according to claim 2, wherein said doping gas including a phosphine gas by which phosphorus is doped into the poly silicon films.

4. A method according to claim 1, wherein said target object being a semiconductor wafer.

5. A method according to claim 1, wherein said disilane gas flowing at a flow rate of 500 to 1,500 SCCM.

6. A method according to claim 1, wherein said temperature being 425° to 500° C.

7. A method according to claim 1, wherein said depressurized atmosphere being 0.1 to 10 Torr.

* * * * *

UNITED STATES PATENT AND TRADEMARK OFFICE
CERTIFICATE OF CORRECTION

PATENT NO. : 5,677,235
DATED : OCTOBER 14, 1997
INVENTOR(S) : KAZUHIDE HASEBE ET AL.

It is certified that error appears in the above-identified patent and that said Letters Patent is hereby corrected as shown below:

On the Title page, delete [73] Assignees in its entirety and replace with
--[73] Assignees: Tokyo Electron Limited, Tokyo, Japan--.

Signed and Sealed this

Twenty-fourth Day of April, 2001

*Attest:*

NICHOLAS P. GODICI

*Attesting Officer*  *Acting Director of the United States Patent and Trademark Office*